United States Patent
Biswas et al.

(10) Patent No.: US 7,694,252 B1
(45) Date of Patent: Apr. 6, 2010

(54) METHOD AND SYSTEM FOR STATIC VERIFICATION OF MULTI-VOLTAGE CIRCUIT DESIGN

(75) Inventors: Saptarshi Biswas, Kolkata (IN); Srikanth Jadcherla, San Jose, CA (US); Sriram Kotni, Fremont, CA (US); Debabrata Bagchi, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 409 days.

(21) Appl. No.: 11/738,483

(22) Filed: Apr. 21, 2007

(51) Int. Cl.
*G06F 17/50* (2006.01)
(52) U.S. Cl. .......................... 716/5; 703/16
(58) Field of Classification Search ............ 716/5; 703/16
See application file for complete search history.

(56) References Cited

U.S. PATENT DOCUMENTS

| | | | |
|---|---|---|---|
| 5,983,006 A * | 11/1999 | Carlson et al. ............ 716/4 |
| 7,546,566 B2 * | 6/2009 | Chilwal et al. ............ 716/5 |
| 2003/0149942 A1 * | 8/2003 | Hsu ........................ 716/1 |
| 2005/0022149 A1 * | 1/2005 | Smith et al. ............... 716/15 |
| 2006/0008037 A1 * | 1/2006 | Chang et al. .............. 375/346 |
| 2006/0149492 A1 * | 7/2006 | Guidry .................... 702/117 |
| 2008/0250364 A1 * | 10/2008 | Chilwal et al. ............ 716/5 |

* cited by examiner

*Primary Examiner*—Phallaka Kik
(74) *Attorney, Agent, or Firm*—Park, Vaughan & Fleming LLP

(57) ABSTRACT

Verification of a design for a multi-voltage circuit which defines a plurality of iso-voltage rail blocks, and which comprises voltage state information for the iso-voltage-rail blocks. Verification includes generating cross-over information regarding a cross-over signal between two iso-voltage-rail blocks, identifying the voltage state relationship between the two iso-voltage-rail blocks based on the voltage state information, and verifying the validity of the cross-over signal based on the determined voltage state relationship.

29 Claims, 8 Drawing Sheets

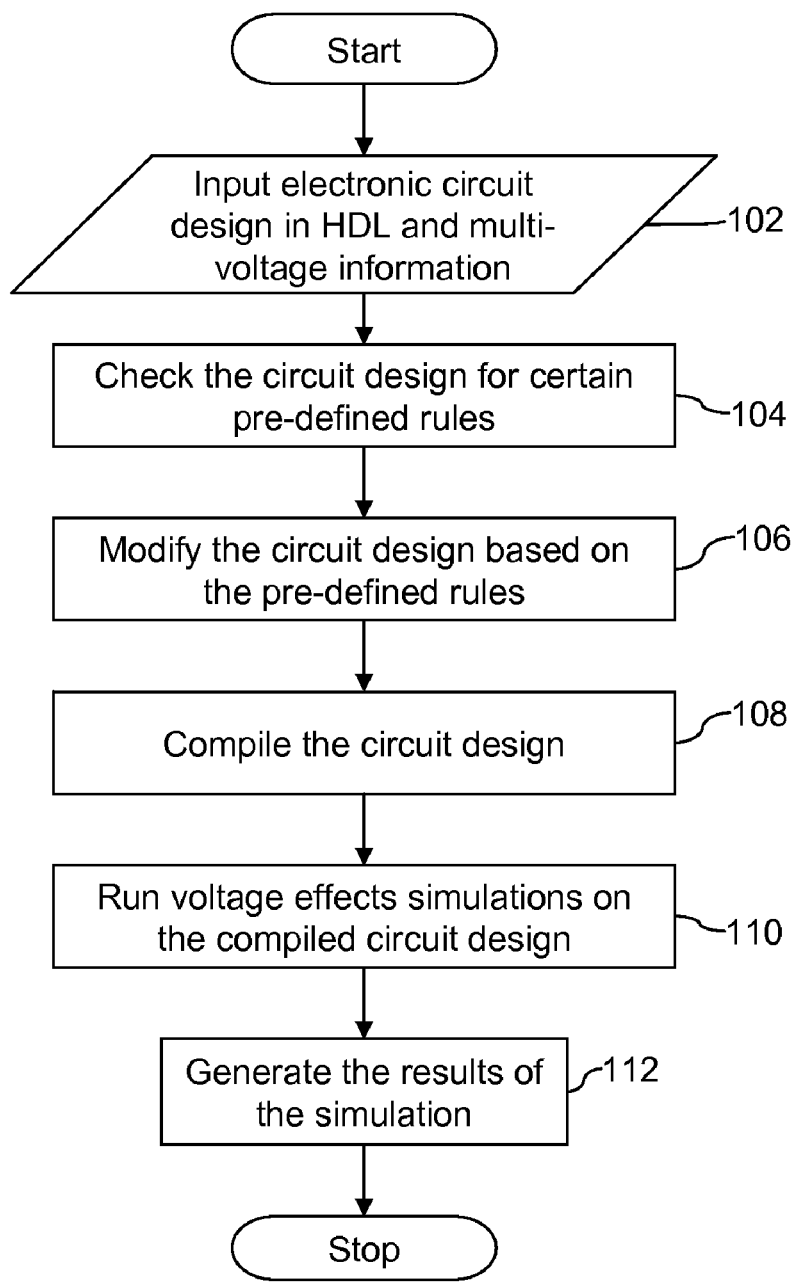
PRIOR ART
FIG. 1

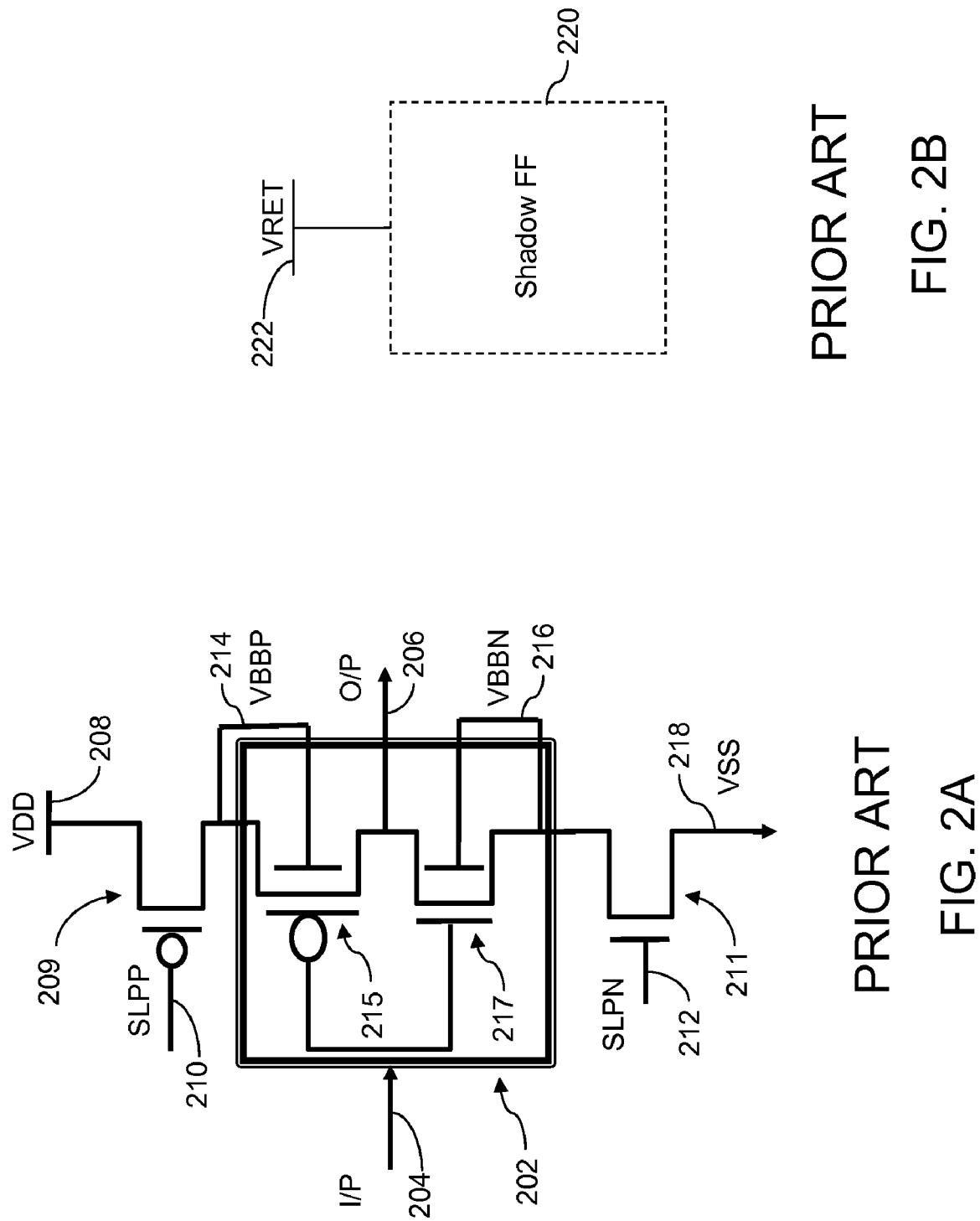
PRIOR ART
FIG. 2B
PRIOR ART
FIG. 2A

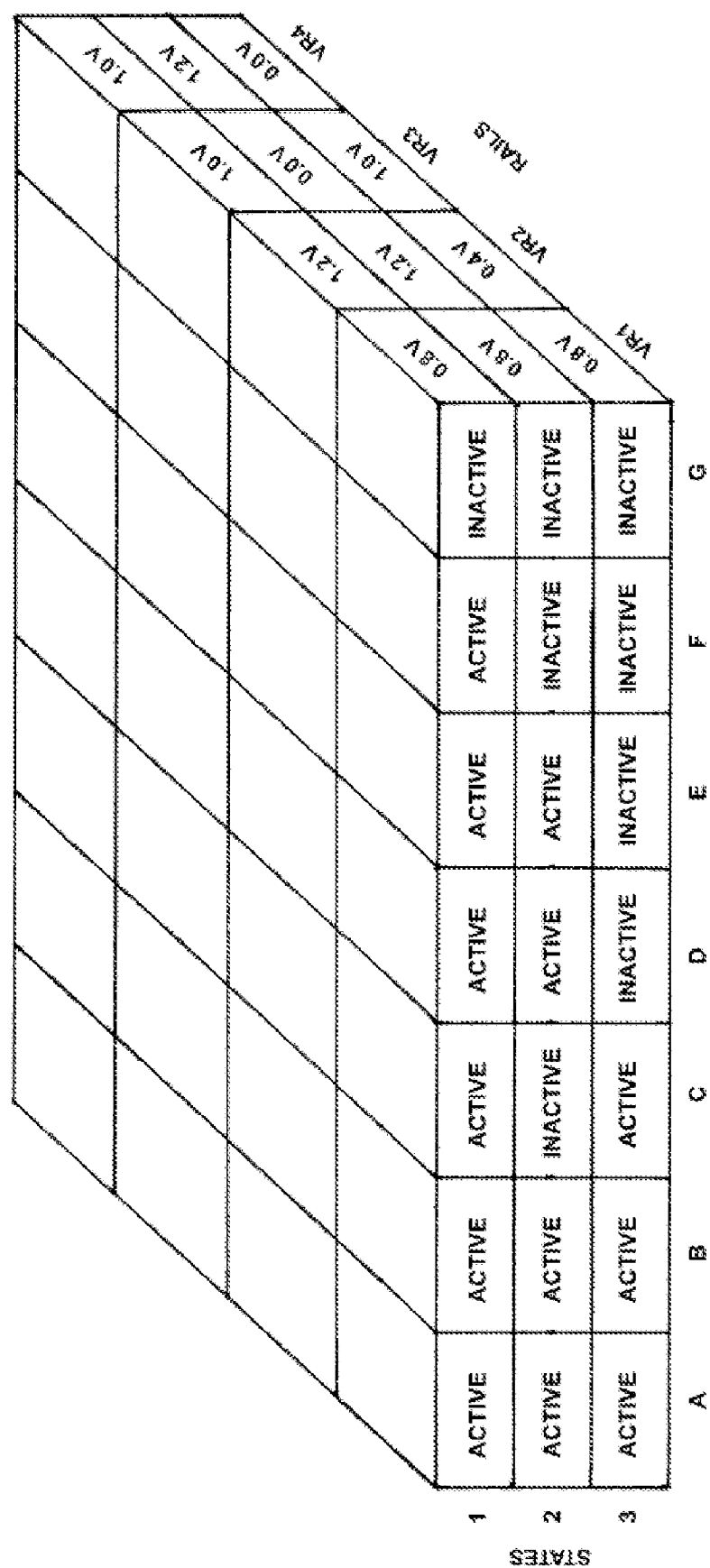
FIG. 3

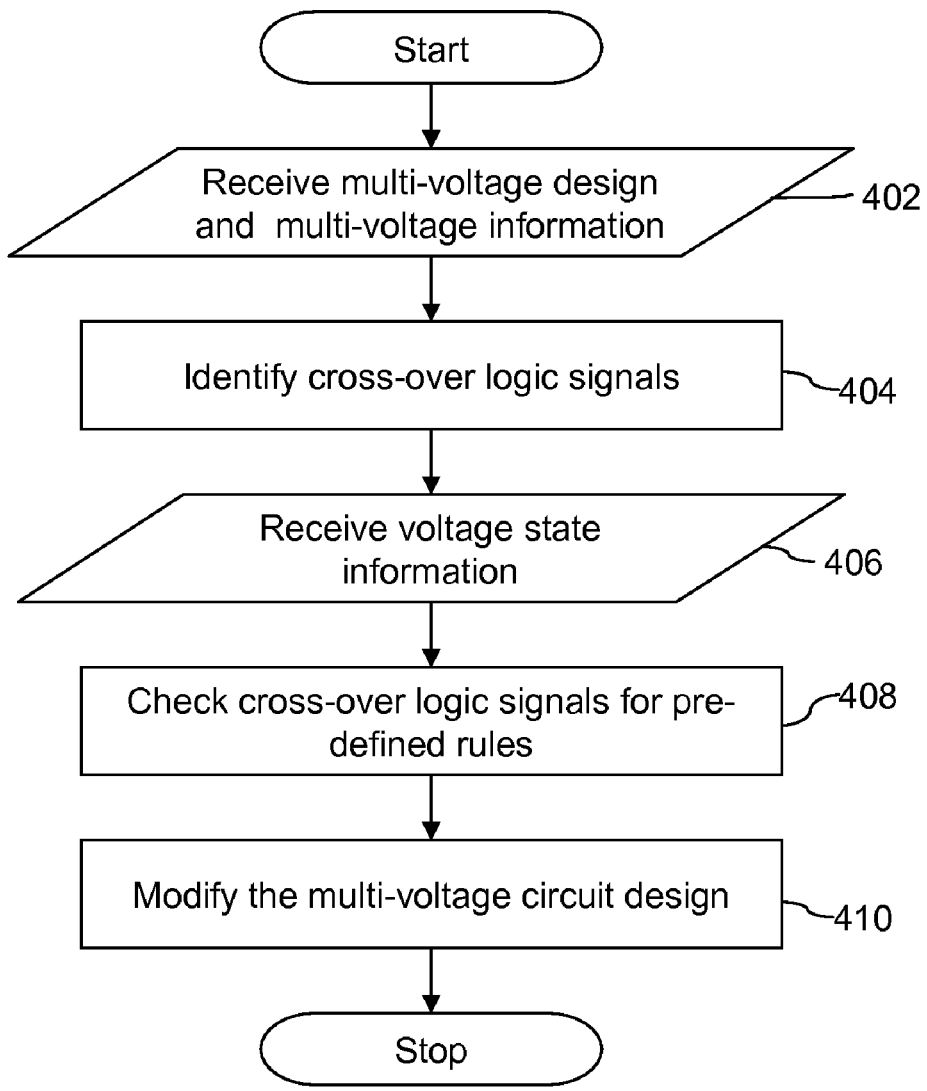
FIG. 4

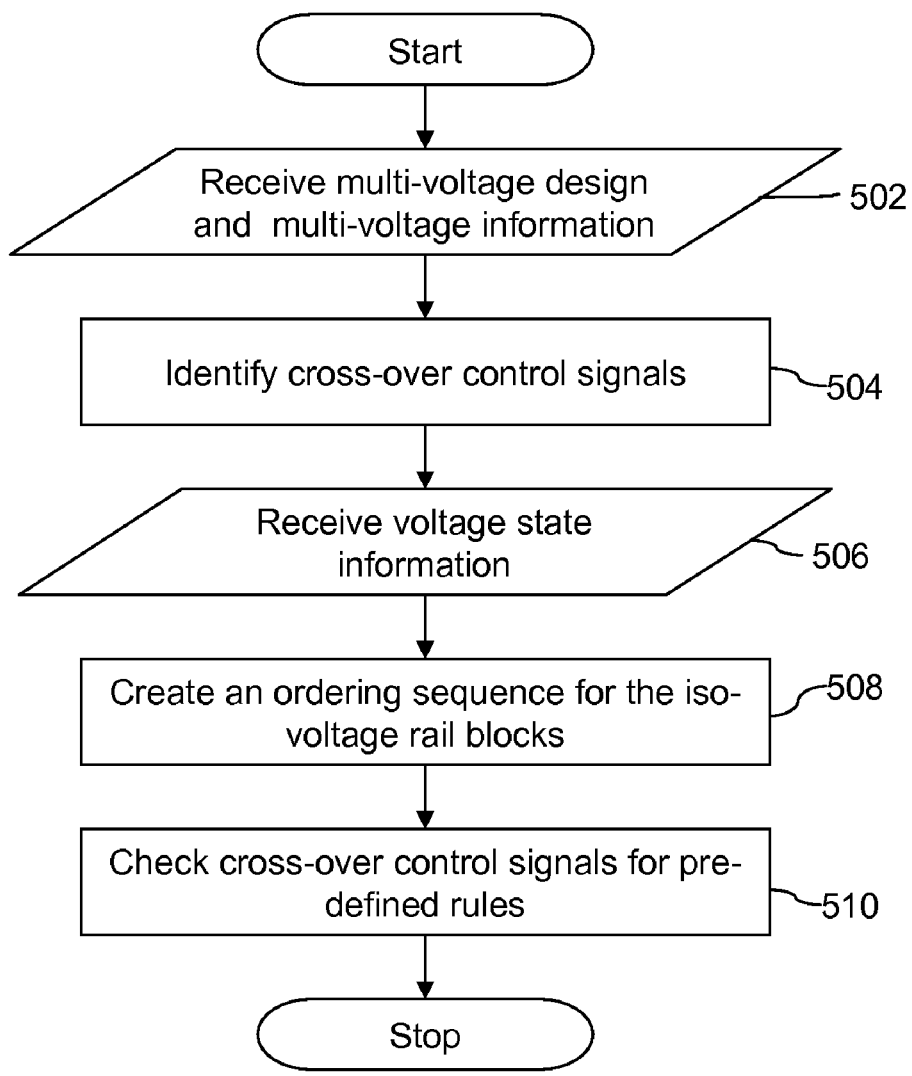
FIG. 5

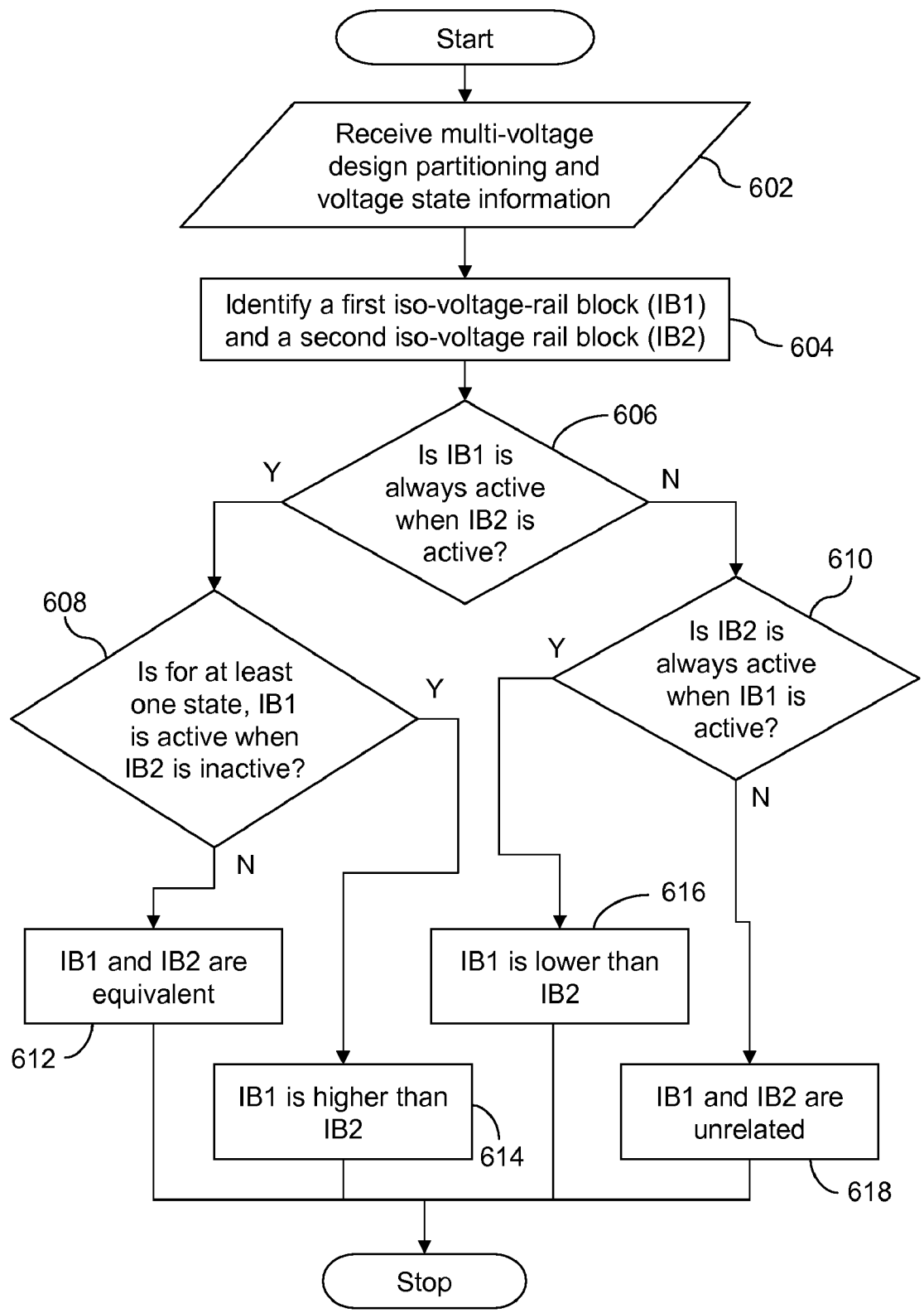
FIG. 6

| Level of Order | |
|---|---|
| Level 1 | A, B |
| Level 2 | C \| D, E |
| Level 3 | F |
| Level 4 | G |

FIG. 7

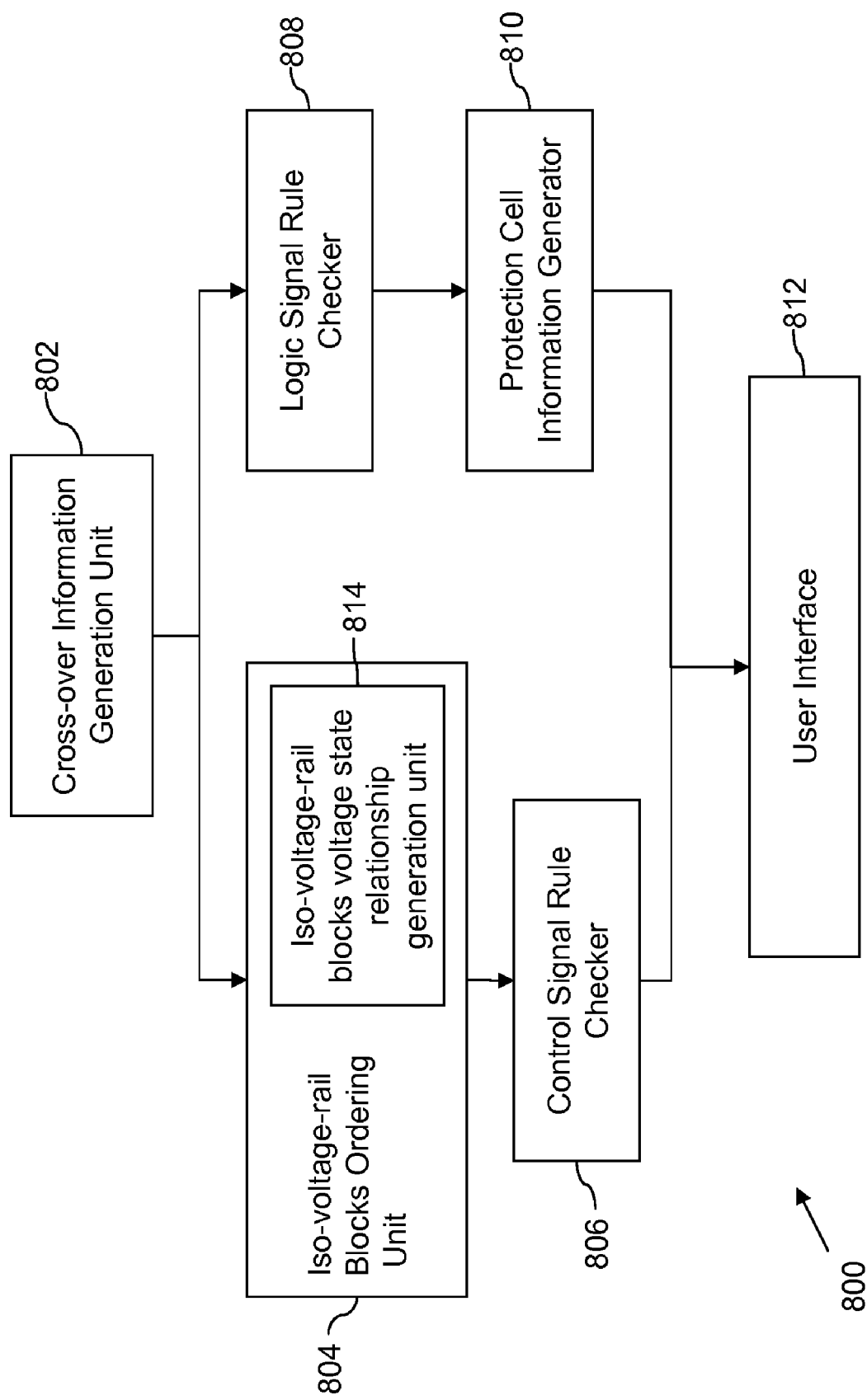
FIG. 8

METHOD AND SYSTEM FOR STATIC VERIFICATION OF MULTI-VOLTAGE CIRCUIT DESIGN

BACKGROUND OF THE INVENTION

1. Technical Field

The invention relates generally to verification of electronic circuit designs, and particularly to validation of multi-voltage circuit designs against predefined rules.

2. Prior Art

Electronic Design Automation (EDA) is a process which uses computer programs to design, simulate, and test electronic circuits before they are fabricated. Using these tools detects and corrects design flaws before fabrication of the silicon device. Test before fabrication processes save manufacturers millions of dollars in Non-Recoverable Engineering (NRE) costs.

An automated circuit design process includes several steps, beginning with providing a Hardware Description Language (HDL) description (a high level description) of a circuit design. Several HDLs are commonly available, e.g. Verilog and VHDL. The HDL description may also be in the form of a Register Transfer Logic (RTL) code. A computer-implemented process converts the high-level description into a netlist, which is a structural representation of the electronic circuit that specifies details on (i) cells that constitute the circuit and (ii) details on the wire connections (nets) of different pins of cells. A netlist does not describe the physical location of the cells on a silicon chip. The netlist creation process is followed by a placement process, which finds a location for each cell on a circuit board or silicon chip. The locations are specified, typically, in two dimensional (i.e., x, y) spatial coordinates on the circuit board or silicon chip. Subsequently, the netlist and the cell location information are used to perform a wire routing process which generates a wire geometry within a data structure for connecting pins together. This information is converted into a description of a mask for fabrication of the actual silicon chip. The description may be provided in available languages such as GDS2.

After certain stages of the automated circuit designing process, the intermediate resulting information needs to be verified for potential errors.

FIG. 1 is a flowchart illustrating a generic method for verification and modification of a multi-voltage circuit design. Step 102 inputs a Hardware Description Language (HDL) description of the multi-voltage design and multi-voltage information. The HDL describes the circuit design in blocks and sub-blocks, which may also be referred to as design elements. Each design element may in itself be a semiconductor device, for example a transistor. A design element may also be a combination of two or more semiconductor devices. Some examples of HDLs that may be used include the commonly available languages Verilog and VHDL. The HDL description may also be in the form of an RTL code. Multi-voltage information comprises design partitioning information and voltage state information, as further detailed in conjunction with FIGS. 2A and 2B. The voltage state information is further detailed in conjunction with FIG. 3.

Step 104 checks the multi-voltage circuit design for certain pre-defined rules. Based on the rule checking step 106 modifies the multi-voltage circuit design.

Step 108 compiles the HDL description of the multi-voltage circuit design to logically validate the design. A typical compilation process converts the HDL into several design objects. The design objects may correspond to each design element, the voltage connections to the design element, the logical connections between design elements, and the like.

Step 110 performs the simulation process, which applies voltage vectors at the inputs of the circuit design. These voltage vectors generate logic waveforms in the circuit design. The logic waveforms in a digital circuit have certain specific values, for example, 0, 1, X and Z in case of Verilog. The voltage vector values varying with time change the resulting logic waveforms, which are observed and recorded. Step 112 generates the simulation results representing the behavior of the circuit for certain parameters. The behavior is then compared with the desired results from the circuit.

Electronic circuits are becoming increasingly complex and consequently encountering new problems of power management. Contemporary electronic circuits consume significant amounts of power, which is undesirable because of heating problems and limited battery life of electronic devices. Therefore, managing power for optimal use is highly desired.

One way of optimizing power consumption is by partitioning multi-voltage electronic circuits and managing power for these partitions separately. In a multi-voltage design, different functional units of the electronic circuit are operated at different voltages at different times. For example, in case of an electronic circuit for a mobile phone, the functional units for audio, processing and camera are different. When the audio unit is being operated, the camera unit may be switched off and the processing unit may be operated at 1.0 V. In another case, when the camera unit is being operated, the audio unit may be switched off and the processing unit may be operated at 1.2 V. A mobile phone circuit design element may have voltage states such as active, standby, sleep, shutdown, etc.

Multi-voltage electronic circuits as described above have complex designs comprising several elements or cells which are characterized by their connections to various power rails carrying different voltages which may change with time.

FIGS. 2A and 2B are schematics of an example design element 202 having input 204 and output 206 connections that carry logic waveforms having particular values, for example 0, 1, X or Z in Verilog. Design element 202 is connected to six voltage rails; a VDD rail 208, a SLPP rail 210, a SLPN rail 212, a VBBP rail 214, a VBBN rail 216, and a VSS rail 218.

VDD rail 208 is a driving rail that provides power to design element 202. SLPP rail 210 and SLPN rail 212 are sleep rails connected to the gates of header transistor 209 and of footer transistor 211 to apply positive, zero, or negative voltage differences between the gate and the source of the transistors and thereby cut off leakage current between rails 208 and 218. VBBP rail 214 and VBBN rail 216 are body bias rails for Positive Metal Oxide Semiconductor (PMOS) transistor 215 and for Negative Metal Oxide Semiconductor (NMOS) transistor 217 respectively, which are applied to the bulk connection and can either be forward or reverse biased to control threshold voltage (Vt).

Other design elements may have connections to fewer or more voltage rails.

The values of voltages on the rails connected to design element 202 determine its voltage state, of which there may be several. An example design element 202 may have four voltage states: active state, shutdown state, standby state and sleep state. During the active state, VDD rail 208 operates on an allotted functional voltage value, and design element 202 can perform all its functions. During shutdown state, VDD rail 208 is either turned off, or the value of voltage in VDD rail 208 is below a shutdown threshold voltage value. However, during this state the voltage value on VDD rail 208 is not zero.

Standby state is a low power state which expects a quick wakeup. During standby state, the voltage value on VDD rail 208 is between a maximum standby threshold voltage value and a minimum standby threshold voltage value. State retention in memory elements of a design element 202 is essential. Typically, in standby state all the clocks are gated, i.e. deactivated by a gating design element such as an AND gate (not shown). Standby state may have multiple grades which progressively turn off more circuitry. Entering and leaving standby state involves gradually turning off/on of clocks, PLLs, and voltages. Sleep state is a variation of shutdown state, and is also called power gating. SLPP 210 and/or SLPN 212 are controlled with a negative Vgs (V gate-source) to cut off design element 202 from VDD 208 and VSS 218.

However, complex voltage designs of electronic circuits make verification of the designs extremely difficult. The above-mentioned generic verification process is insufficient for validation of multi-voltage circuit designs. Existing methods for checking multi-voltage electronic circuit designs suffer from one or more of the following problems. First, the verification tools for electronic circuits are not voltage aware, i.e. they do not consider voltage as a parameter for performing the verification, although in reality voltage is a key parameter. Therefore, any design verification tool without consideration of voltage is susceptible to lead to faulty designs. Second, the existing methods of verification of multi-voltage circuit designs do not provide the required accuracy. Third, the existing verification methods are slow and therefore require long time to generate results. There exists, therefore, a need for a verification method of electronic circuit designs that overcomes the limitations of existing systems.

SUMMARY OF THE INVENTION

The invention provides a method and system for verification of a multi-voltage circuit design which checks the design for certain predefined rules based on voltage partitioning of the design and appropriate connections between the partitions. The method for verification of a multi-voltage circuit design is fast.

One embodiment provides a method for verification of a multi-voltage circuit design which defines a plurality of iso-voltage-rail blocks. Each design element within an iso-voltage-rail block is connected to the same set of voltage rails. The multi-voltage circuit design also uses voltage state information for the iso-voltage rail blocks. The method for verification includes the steps of generating cross-over information regarding a cross-over signal between two iso-voltage-rail blocks, identifying the voltage state relationship between the two iso-voltage-rail blocks based on the voltage state information, and verifying the validity of the cross-over signal based on the determined voltage state relationship.

BRIEF DESCRIPTION OF THE DRAWINGS

FIG. 1 is a flowchart illustrating a conventional method for verification and modification of a multi-voltage circuit design;

FIGS. 2A and 2B are schematics representing voltage rails connected to a design element;

FIG. 3 is an exemplary three dimensional table representing the voltage state information in accordance with an embodiment of the invention;

FIG. 4 is a flowchart illustrating a method for ensuring multi-voltage safety on cross-over logic signals and modifying the multi-voltage circuit design in accordance with an embodiment of the invention;

FIG. 5 is a flowchart illustrating a method for checking cross-over control signals in accordance with an embodiment of the invention;

FIG. 6 is a flowchart illustrating the method for establishing a voltage state relationship between two iso-voltage-rail blocks;

FIG. 7 is an exemplary table representing the order of iso-voltage-rail blocks in accordance with an embodiment of the invention; and FIG. 8 is a schematic representing a system for checking and modifying a multi-voltage circuit design, in accordance with an embodiment of the invention.

DETAILED DESCRIPTION

Iso-Voltage-Rail Blocks and Voltage Rails

As explained in the Background section above, a multi-voltage circuit design includes partitioning information that defines one or more iso-voltage rail blocks. Within an iso-voltage rail block each design element is connected to the same set of voltage rails, which are voltage connections. For example, a voltage rail may be a driving (VDD) voltage rail or a ground (VSS) voltage rail. In CMOS circuits VDD is the source for PMOS transistors and VSS is the source for NMOS transistors. Being connected to the same voltage rails means that at any given time all design elements within an iso-voltage-rail block have the same voltage state. Therefore the voltage state of the design elements within an iso-voltage-rail block may also be called the voltage state of the iso-voltage-rail block, and the entire iso-voltage-rail block may be considered as a single entity for a number of purposes. This simplifies designing a circuit and speeds simulation. Different iso-voltage rail blocks may have different voltage states during a voltage state of the overall circuit design.

Voltage State Information

FIG. 3 is an exemplary voltage state table, one or more of which comprises the voltage state information in accordance with an embodiment of the invention. FIG. 3 is a three-dimensional table, in which the first (vertical) axis represents the voltage states of the overall circuit design, the second (horizontal) axis represents the iso-voltage-rail blocks of the circuit design, and the third (depth) axis represents the voltage rails of the circuit design. There are three voltage states of the overall multi-voltage circuit design; State 1, State 2, and State 3, seven iso-voltage-rails blocks A, B, C, D, E, F, and G, and four voltage rails VR1, VR2, VR3, and VR4. Cells of the table contain the voltage states of the corresponding iso-voltage-rail block during the corresponding voltage state of the overall circuit design. The inactive voltage state may be sleep voltage state, standby voltage state, or shutdown voltage state. Cells of the table also contain the values of voltages in the corresponding voltage rail during the corresponding voltage state of the overall circuit design. For example, during State 2 of the overall multi-voltage-rail block, the value of voltage in voltage rail VR1 is 0.8V, VR2 is 1.2V, VR3 is 0.0V, and VR4 is 1.2 V. Similarly, the value of voltage in voltage rail VR3 during State 1 is 1.0V, during State 2 is 0.0V, during State 3 is 1.0V. Preferably, one or more voltage state tables define the values of voltage in all rails during all states of the overall multi-voltage circuit.

As discussed in conjunction with FIGS. 2A and 2B, the voltage state of any iso-voltage-rail block can be determined from the value of voltage in the voltage rails connected to the iso-voltage-rail block. Likewise, by using the FIG. 3 rail voltage state table values in the example table below, the voltage state of each iso-voltage-rail block can be found for the FIG. 3 iso-voltage-rail blocks voltage state table.

| Driving rail | Sleep header | Sleep footer | Voltage State of Iso-Voltage-Rail Block |
|---|---|---|---|
| Shutdown value (typically 0) | Any value | Any value | Shutdown |
| Greater than shutdown value | Greater than or equal to driving rail | Any value | Sleep |
|  | Any value | Less than or equal to VSS / ground rail i.e. 0.0 |  |
|  | Greater than or equal to driving rail | Less than or equal to VSS / ground rail i.e. 0.0 |  |
| Standby Value | Less than VDD | Greater than 0.0 | Standby |
| Greater than standby value | Less than VDD | Greater than 0.0 | Active |

Cross-Over Signals

Signals originating in one iso-voltage-rail block and terminating in another iso-voltage rail block are called cross-over signals. The iso-voltage rail block in which a cross-over signal originates is called the source iso-voltage-rail block and the block in which a cross-over signal terminates is called the destination iso-voltage-rail block for that cross-over signal.

Cross-over signals may be of two types: either cross-over logic signals or cross-over control signals. Logic signals carry logic waveforms that have certain specific logical values, for example, 0, 1, X or Z, in the case of Verilog. Control signals can be indicator signals that provide information regarding the voltage state of a particular iso-voltage-rail block. Control signals may also be clock signals, reset signals, scan signals or sleep signals. It will be apparent to those skilled in the art that other kinds of control signals may exist.

Rule Checking of Logic Signals

FIG. 4 is a flowchart illustrating a method for ensuring multi-voltage safety on cross-over logic signals and for modifying a multi-voltage circuit design in accordance with an embodiment of the invention. Step 402 receives a multi-voltage circuit design and multi-voltage information including partitioning information, based on which step 404 identifies cross-over logic signals. At step 406 the voltage state information is received.

Step 408 checks the multi-voltage circuit design for conformance to certain predefined rules. The rule checking process includes checking for the presence, and type, of protection cells in the destination cross-over iso-voltage-rail blocks.

One example predefined rule for a cross-over logic signal requires a level shifter protection cell at the destination iso-voltage-rail block of the cross-over logic signal, if there is a difference between the operating voltage values of the source iso-voltage-rail block and the destination iso-voltage-rail block. Level shifter protection cells change the values of the voltages in the rails carrying the cross-over signals such that the original logical values of the signals remain the same in the destination iso-voltage-rail block. For example, in the case of a cross-over logic signal between iso-voltage-rail block A and iso-voltage-rail block B, if the operating voltage for iso-voltage-rail block A is 0.8 V and that for iso-voltage-rail block B is 1.2 V, then a logic signal '1' from iso-voltage-rail block A will carry a voltage of 0.8V. However, the value of voltage for logic signal '1' as read by iso-voltage-rail block B is 1.2 V. Therefore, iso-voltage-rail block B would assume a signal of 0.8 V to be a logic signal 'X'. Instead, a level shifter protection cell in iso-voltage rail block B can convert the cross-over logic signal voltage value from 0.8 V to 1.2 V. An embodiment of the invention checks for the pre-defined rule that the difference between the voltages of voltage rails across a level shifter cell must not exceed 30 percent of the voltage in the source voltage rail of the level shifter cell. Level shifter protection cells may be high voltage to low voltage level shifters or low voltage to high voltage level shifters. There may also be level shifter protection cells that are capable of both high voltage-to-low voltage and low voltage-to-high voltage level shifting.

Another example predefined rule for a cross-over logic signal requires an isolation protection cell in a destination iso-voltage-rail block at the point where a cross-over signal is received if, for at least one voltage state of the overall multi-voltage circuit design, the source iso-voltage-rail block is in an inactive state and the destination iso-voltage-rail block is in active state. Isolation protection cells are required at the inputs of destination iso-voltage-rail block to protect against logic signals coming from inactive iso-voltage-rail blocks. For example, in a certain voltage state of an overall circuit design, when originating iso-voltage-rail block C is inactive and terminating iso-voltage-rail block D is active, the cross-over signal is 'Z' but this signal is not desired within iso-voltage-rail block D, so it is stopped by an isolation cell.

There may also be certain protection cells that are a combination of isolation and level shifter protection cells to perform the functions of both.

Step 410 modifies the multi-voltage circuit design as necessary to include appropriate protection cells at the inputs of destination iso-voltage-rail blocks.

Rule Checking of Indicator Signals in Isolation Cells

An isolation cell has two inputs. One input is the logic or control signal that has to be isolated. The other input is an indicator signal that gates the passing signal through the isolation cell. In accordance with an embodiment of the invention, the indicator signal for an isolation cell is checked for certain predefined rules.

There are three exemplary predefined rules for checking indicator signals for an isolation cell. First, the indicator signal for an isolation cell should correspond with the source iso-voltage-rail block of the logic or control signal that is isolated by the isolation cell. Second, the polarity of the indicator signal for an isolation cell must correspond with the polarity of the isolation cell. For example, if the input required for gating an isolation cell is +ve 1.0V, then the indicator signal must provide +ve 1.0V to the isolation cell. Third, if the source iso-voltage rail block for the isolation cell goes to shutdown state, the indicator should be the driving rail indicator. If, however, the source iso-voltage-rail block goes to sleep state, the sleep signal indicator should be considered as the indicator instead. If the source iso-voltage-rail block may go to both shutdown and sleep voltage states during different voltage states of the entire multi-voltage circuit design, both driving rail indicator and sleep signal indicator are checked for the defined rules.

Rule Checking of Control Signals

FIG. 5 is a flowchart illustrating a method for checking cross-over control signals in accordance with an embodiment of the invention. Step 502 receives multi-voltage circuit design and multi-voltage information comprising partitioning information. At step 504, cross-over control signals are identified based on the partitioning information. At step 506 the voltage state information is received. At step 508, an ordering sequence of the iso-voltage-rail blocks is created, based on the received state information. The ordering sequence defines the voltage state relationship between two iso-voltage-rail blocks. The voltage state relationship may be equivalent, higher than, lower than or unrelated. The identification of voltage state relationships between two iso-voltage rail blocks is further detailed in conjunction with FIG. 6.

Thereafter at step 510, cross-over control signals are checked for certain pre-defined rules. An embodiment of the invention applies the following predefined rules for a cross-over control signal: 1) if the source iso-voltage-rail block is higher than or equivalent to the destination iso-voltage-rail block of a cross-over control signal, then no action is taken; and 2) if the source iso-voltage-rail block is lower than or unrelated to the destination iso-voltage-rail block of a cross-over control signal, then violation error message is displayed to the designer of the multi-voltage circuit design.

For example, in case of an indicator cross-over control signal, the predefined rules state that in case the indicator cross-over control signal originates in or passes through a lower iso-voltage-rail block and terminates at a higher iso-voltage-rail block, then an error is reported. For a particular voltage state of the entire multi-voltage circuit design, the indicator cross-over control signal may not have enough strength to drive the isolation cell in the destination iso-voltage rail block. This situation may create an electrical hazard.

Architectural Rule Checks

One embodiment of the invention checks the multi-voltage circuit design for conformance to certain architectural rules, and applies static checks for validating these rules. The following table provides examples of these architectural rules:

| Rule | Description | If true, then |
| --- | --- | --- |
| All off state | Check to determine any voltage state of the entire multi-voltage circuit design, where all iso-voltage-rail blocks are in inactive voltage state | Invalid architecture of the multi-voltage circuit design |
| No iso-voltage-rail block | Check if no iso-voltage-rail block is specified in the multi-voltage circuit design | Invalid architecture of the multi-voltage circuit design |
| No voltage state | Check if no voltage state is specified in the multi-voltage circuit design | Invalid architecture of the multi-voltage circuit design |
| Iso-voltage-rail block without driving rail | Check if an iso-voltage-rail block is without any associated driving voltage rail | Invalid architecture of the iso-voltage rail block |
| VDD off, any other voltage rail on | Check if for any voltage states in an iso-voltage-rail block where VDD is off, any other rails are on | Invalid architecture of the iso-voltage rail block |
| VDD > retention | Check if Retention voltage is greater than voltage on VDD for any iso-voltage-rail block | Invalid architecture of the iso-voltage rail block |
| retention > standby | Check if Standby voltage is greater than Retention voltage for any iso-voltage-rail block | Invalid architecture of the iso-voltage rail block |
| standby > shutdown | Check if Shutdown voltage is greater than Standby voltage for any iso-voltage-rail block | Invalid architecture of the iso-voltage rail block |
| Iso-voltage-rail block never active | Check if an iso-voltage rail block is always in an inactive state | Invalid architecture of the multi-voltage circuit design |

Voltage State Relationships between Iso-Voltage-Rail Blocks

FIG. 6 is a flowchart illustrating the FIG. 5 step 508 method for establishing voltage state relationship between two iso-voltage-rail blocks. At step 602, multi-voltage information including the design partitioning information and voltage state information is received. Thereafter, at step 604, two iso-voltage-rail blocks, iso-voltage-rail block 1 (IB1) and iso-voltage-rail block 2 (IB2), are identified. The voltage state relationship needs to be established between IB1 and IB2. Step 606 tests whether IB1 is always in active state when IB2 is in active state. If so, then step 608 is executed, or if not then step 610 is executed.

Step 608 tests whether IB1 is active when IB2 is inactive, for at least one state of the entire multi-voltage design. If the condition of step 608 is false, then step 612 is executed, otherwise step 614 is executed. At step 612, the voltage state relationship between IB1 and IB2 is established as equivalent. At step 614, the voltage state relationship between IB1 and IB2 is established as 'IB1 is higher than IB2.'

Step 610 tests whether IB2 is always in active state when IB1 is in active state. If the condition of step 610 is true, then step 616 is executed, otherwise step 618 is executed. At step 616, the voltage state relationship between IB1 and IB2 is established as; IB1 is lower than IB2. At step 618, the voltage state relationship between IB1 and IB2 is established as unrelated.

Order of Iso-Voltage-Rail Blocks

The information from the FIG. 3 iso-voltage-rail blocks voltage state table is used to establish the voltage state relationship between each pair of iso-voltage-rail blocks. For example, Iso-voltage-rail block A is always active when iso-voltage-rail block B is active, and iso-voltage-rail block B is always active when iso-voltage-rail block A is active. Therefore, the voltage state relationship between iso-voltage-rail block A and iso-voltage-rail block B is equivalence. Similarly, the voltage state relationship between iso-voltage-rail block A and iso-voltage-rail block C is: A is higher than C. The voltage state relationships between the iso-voltage-rail blocks are used to create an ordering sequence of the iso-voltage-rail blocks.

FIG. 7 is an exemplary iso-voltage-rail blocks ordering table defining different levels of order of iso-voltage-rail blocks, of which Level 1 is the highest level. Any iso-voltage-rail block, which is higher than another iso-voltage-rail block in terms of the voltage state relationship, is placed on a higher level than the other iso-voltage-rail block. For example, since iso-voltage-rail block A is higher than iso-voltage-rail block C, it is placed on a higher level (Level 1) than iso-voltage-rail block C, which is placed on Level 2. Two iso-voltage-rail blocks, which are equivalent or unrelated in terms of voltage state relationship, are placed on the same level. For example, iso-voltage-rail blocks A and B are equivalent and are on the same level (Level 1). Also iso-voltage-rail block C and iso-voltage-rail block D are unrelated and are, therefore, placed on the same level.

FIG. 8 is a schematic representing a system for checking and modifying a multi-voltage circuit design in accordance with an embodiment of the invention. System 800 comprises a cross-over information generation unit 802, an iso-voltage-rail blocks ordering unit 804, a control signal rule checker 806, a logic signal rule checker 808, a protection cell information generation unit 810 and a user interface 812.

Cross-over information generation unit 802 receives multi-voltage circuit design and multi-voltage information, identifies all logic and control cross-over signals, and generates cross-over information regarding the identified logic and control cross-over signals. Cross-over information includes voltage state information for the source and destination iso-voltage-rail blocks for the identified cross-over signals. Cross-over information generation unit 802 sends the cross-over information related to all identified cross-over control signals to iso-voltage-rail blocks ordering unit 804, and the cross-over information related to all identified cross-over logic signals to logic signal rule checker 808.

Based on the voltage state relationships between each pair of iso-voltage-rail blocks, iso-voltage-rail blocks ordering unit 804 generates an order as in FIG. 7 for the iso-voltage-rail blocks. Iso-voltage-rail blocks ordering unit 804 also includes an iso-voltage-rail blocks voltage state relationship generation unit 814 which generates the voltage state relationships between each pair of iso-voltage-rail blocks. Iso-voltage-rail blocks ordering unit 804 sends the order of iso-voltage rail blocks and the voltage state relationships information to control signal rule checker 806.

Control signal rule checker 806 checks the multi-voltage circuit design for certain pre-defined rules based on the validity of a cross-over control signal. The validity of a cross-over control signal is determined by the voltage state relationship between the source and destination iso-voltage-rail block between for the cross-over signal. The result of the rule checking is sent to user interface 812. User interface 812 displays the result of the rule checking to the circuit designer.

Logic signal rule checker 808 checks the multi-voltage circuit design for certain pre-defined rules based on the validity of a cross-over logic signal and the presence of an appropriate protection cell. The results of the rule checking are sent to protection cell information generator 810. Protection cell information generator 810 determines the appropriate protection cell that needs to be added on the destination iso-voltage-rail block of a cross-over logic signal. Further, protection cell information generator 810 modifies the circuit design to include the appropriate protection cell in the destination iso-voltage-rail block of the cross-over logic signal. The result of the rule checking and the circuit modifications are sent to user interface 812. User interface 812 displays the result of the rule checking to the circuit designer.

The invention as described may be embodied in the form of a processing machine such as a computer, a programmed microprocessor, an integrated circuit, or other devices or arrangements of devices that are capable of implementing the steps of the method of the invention. While preferred embodiments of the invention have been illustrated and described, the invention is not limited to these embodiments. Numerous modifications, changes, variations, substitutions and equivalents will be apparent to those skilled in the art without departing from the spirit and scope of the invention as defined in the claims.

What is claimed is:

1. A method for verifying a design for a multi-voltage circuit including a plurality of iso-voltage rail blocks, said design comprising voltage state information for the iso-voltage-rail blocks, comprising the steps of:

generating cross-over information on a cross-over signal between a first iso-voltage-rail block and a second iso-voltage rail block, based on the voltage state information;

determining the voltage state relationship between the first iso-voltage-rail block and the second iso-voltage rail block, based on the voltage state information; and verifying, by using one or more computers, the validity of the cross-over signal based on the determined voltage state relationship.

2. The method of claim 1 wherein the multi-voltage circuit design comprises an HDL description.

3. The method of claim 2 wherein the HDL description is in the form of an RTL code.

4. The method of claim 1 wherein the voltage state information comprises voltage state information for each iso-voltage-rail block during each voltage state of the multi-voltage circuit.

5. The method of claim 1 wherein the cross-over signal is a control signal.

6. The method of claim 1 further comprising the step of modifying the multi-voltage circuit design based on the validity of the cross-over signal.

7. The method of claim 1 wherein the step of determining checks if the first iso-voltage-rail block is always active when the second iso-voltage block is active.

8. The method of claim 1 wherein the step of verifying checks the multi-voltage circuit design for pre-defined rules.

9. A system for verifying a design for a multi-voltage circuit design including a plurality of iso-voltage rail blocks, said design comprising voltage state information for the iso-voltage-rail blocks, comprising:

a cross-over information generation unit for generating information on a cross-over signal between a first isovoltage-rail block and a second iso-voltage-rail block based on the voltage state information;

a voltage state relationship generation unit for determining the voltage state relationship between the first iso-voltage-rail block and the second iso-voltage-rail block based on the voltage state information; and a cross-over signal rule checker for verifying the validity of the cross-over signal based on the voltage state relationship.

10. The system of claim 9 wherein the multi-voltage circuit design comprises an HDL description.

11. The system of claim 10 wherein the HDL description is in the form of an RTL code.

12. The system of claim 10 wherein the voltage state information comprises the voltage state information for each iso-voltage-rail block during each voltage state of the multi-voltage circuit.

13. The system of claim 10 wherein the cross-over signal is a control signal.

14. The system of claim 10 further comprising a circuit modifier for modifying the multi-voltage circuit design based on the validity of the cross-over signal.

15. A computer readable medium storing a computer readable program code for causing a computer to perform a verification of a multi-voltage circuit design which defines a plurality of iso-voltage rail blocks and includes voltage state information for the iso-voltage-rail blocks, the verification comprising the steps of:

generating cross-over information on a cross-over signal between a first iso-voltage-rail block and a second iso-voltage rail block, based on the voltage state information;

determining the voltage state relationship between the first iso-voltage-rail block and the second iso-voltage rail block, based on the voltage state information; and verifying the validity of the cross-over signal based on the determined voltage state relationship.

16. The computer readable medium of claim 15 wherein said verification further comprises the step of modifying the multi-voltage circuit design based on the validity of the cross-over signal.

17. The computer readable medium of claim 15 wherein the voltage state information comprises the voltage state information for each iso-voltage-rail block during every voltage state of the entire multi-voltage circuit design.

18. The computer readable medium of claim 15 wherein the cross-over signal is a control signal.

19. The computer readable medium of claim 15 wherein the step of determining checks if the first iso-voltage-rail block is always active when the second iso-voltage block is active.

20. The computer readable medium of claim 15 wherein the step of verifying checks the multi-voltage circuit design for pre-defined rules.

21. A method of verifying a design for a multi-voltage circuit, comprising:

receiving a description of a multi-voltage circuit including multiple iso-voltage-rail blocks and pre-defined rules;

receiving multi-voltage information;

identifying cross-over signals based on the multi-voltage information;

receiving voltage state information; and checking, by using one or more computers, the cross-over signals for conformance to the pre-defined rules.

22. The method of claim 21 wherein:

the cross-over signals include logic signals;

the step of checking checks the logic signals for the presence of a protection cell at an input of a destination iso-voltage-rail block; and comprising the further step of modifying the circuit design as necessary to conform with the pre-defined rules.

23. The method of claim 22 wherein a protection cell comprises a level shifter protection cell.

24. The method of claim 22 wherein a protection cell comprises an isolation protection cell that receives an indicator signal.

25. The method of claim 24 wherein the step of checking checks for conformance with a predefined rule that the indicator signal must correspond with the source iso-voltage-rail block of the signal that is isolated by the isolation cell.

26. The method of claim 24 wherein the step of checking checks for conformance with a predefined rule that the polarity of the indicator signal must correspond with the polarity of the isolation cell.

27. The method of claim 24 wherein the step of checking checks for conformance with a predefined rule that if the source iso-voltage rail block for the isolation cell goes to shutdown state, the indicator should be the driving rail indicator, and if the source iso-voltage-rail block goes to sleep state then the sleep signal indicator should be considered as the indicator instead.

28. The method of claim 21 wherein the cross-over signals include control signals.

29. The method of claim 21 wherein the predefined rules include architectural rules and the step of checking checks whether the circuit design conforms to the architectural rules.

* * * * *